United States Patent
Kim et al.

(10) Patent No.: US 7,958,382 B2
(45) Date of Patent: Jun. 7, 2011

(54) LATENCY SIGNAL GENERATOR AND METHOD THEREOF

(75) Inventors: Hyun-jin Kim, Suwon-si (KR); Ho-young Song, Hwaseong-si (KR); Seong-jin Jang, Seongnam-si (KR); Youn-sik Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 901 days.

(21) Appl. No.: 11/896,788

(22) Filed: Sep. 6, 2007

(65) Prior Publication Data

US 2008/0056019 A1 Mar. 6, 2008

(30) Foreign Application Priority Data

Sep. 6, 2006 (KR) .................. 10-2006-0085804

(51) Int. Cl.
*G06F 1/00* (2006.01)
*G06F 1/04* (2006.01)

(52) U.S. Cl. ... 713/500; 713/400; 713/401; 365/189.05; 365/189.15; 365/233.1; 365/233.15

(58) Field of Classification Search .................. 713/500, 713/400, 401; 365/189.05, 189.15, 233.1, 365/233.17
See application file for complete search history.

(56) References Cited

U.S. PATENT DOCUMENTS

| | | | | |
|---|---|---|---|---|
| 6,320,818 | B1 * | 11/2001 | Matsubara | 365/233.14 |
| 6,662,304 | B2 * | 12/2003 | Keeth et al. | 713/400 |
| 7,170,819 | B2 * | 1/2007 | Szczypinski | 365/189.05 |
| 2002/0093871 | A1 * | 7/2002 | Kwak | 365/233 |

FOREIGN PATENT DOCUMENTS

| | | |
|---|---|---|
| JP | 2005-158165 | 6/2005 |
| KR | 2003-0046128 | 6/2003 |
| KR | 10-0532441 | 11/2005 |

* cited by examiner

*Primary Examiner* — Nitin C Patel
(74) *Attorney, Agent, or Firm* — Harness, Dickey & Pierce, P.L.C.

(57) ABSTRACT

A latency signal generator and method thereof are provided. The example latency signal generator may include a sampling clock signal generator adjusting a plurality of initial sampling clock signals based on a received clock signal to generate a plurality of adjusted sampling clock signals, a latch enable signal supply unit adjusting a plurality of initial latch enable signals based on a given one of the plurality of initial sampling clock signals to generate a plurality of adjusted latch enable signals and a latch unit including a plurality of latency latches, each of the plurality of latency latches selectively latching a given internal read command based on one of the plurality of adjusted sampling clock signals and one of the plurality of adjusted latch enable signals.

28 Claims, 10 Drawing Sheets

LATENCY SIGNAL GENERATOR AND METHOD THEREOF

PRIORITY STATEMENT

This application claims the benefit of Korean Patent Application No. 10-2006-0085804, filed on Sep. 6, 2006, in the Korean Intellectual Property Office, the disclosure of which is incorporated herein in its entirety by reference.

BACKGROUND

1. Field

Example embodiments relate generally to a latency signal generator and method thereof.

2. Description of the Related Art

A conventional synchronization semiconductor memory device may receive and transmit data in synchronization with an external clock signal. The synchronization semiconductor memory device may set, in advance, the number of clock cycles in which valid data is output in response to a read command of a memory controller. The number of clock cycles between when a read command (or a column address) is input into the synchronization semiconductor memory device until corresponding data (e.g., read response data) is output to an external entity may be referred to as "CAS latency". A latency signal generator included in the synchronization semiconductor memory device may control data so as to conform to the CAS latency.

Figure 1:
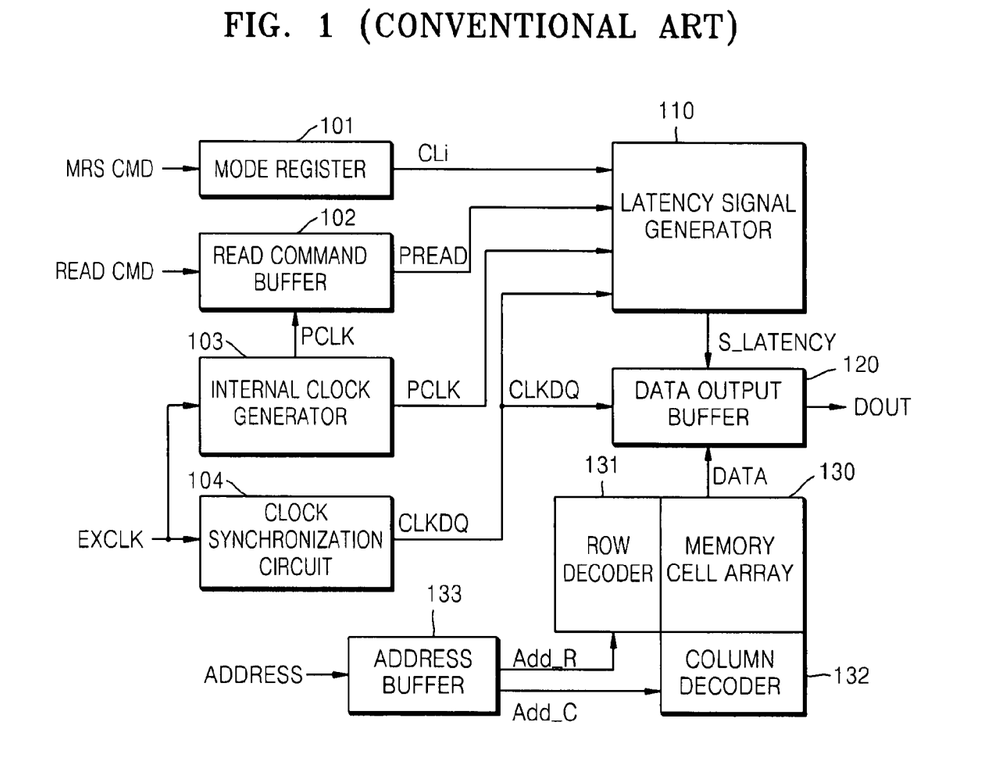
FIG. 1 is a block diagram illustrating a conventional synchronization semiconductor memory device including a latency signal generator.

FIG. 1 is a block diagram illustrating a conventional synchronization semiconductor memory device including a latency signal generator.

Referring to FIG. 1, the synchronization semiconductor memory device may include a mode register 101 for outputting CAS latency CLi set by a mode register set command MRS CMD, a read command buffer 102 for generating an internal read command PREAD from a read command READ CMD, an internal clock generator 103 for receiving an external clock signal EXCLR and generating an internal clock signal PCLK, a clock synchronization circuit 104 for generating a data output clock signal CLKDQ based on the external clock signal EXCLK, a latency signal generator 110 for generating a latency signal S_LATENCY, an address buffer 133 for receiving an address ADDRESS and outputting a row address signal Add_R and a column address signal Add_C, a row decoder 131, a column decoder 132, a memory cell array 130 for outputting memory cell data DATA and a data output buffer 120. Referring to FIG. 1, the clock synchronization circuit 104 may be a delay locked loop (DLL).

Referring to FIG. 1, the latency signal generator 110 may receive the CAS latency CLi, the internal read command PREAD, the internal clock signal PCLK, and the data output clock signal CLKDQ, and may generate a latency signal S_LATENCY. The data output buffer 120 may output output data DOUT to an external entity based on the data output clock signal CLKDQ if the latency signal S_LATENCY is output.

Figure 2:
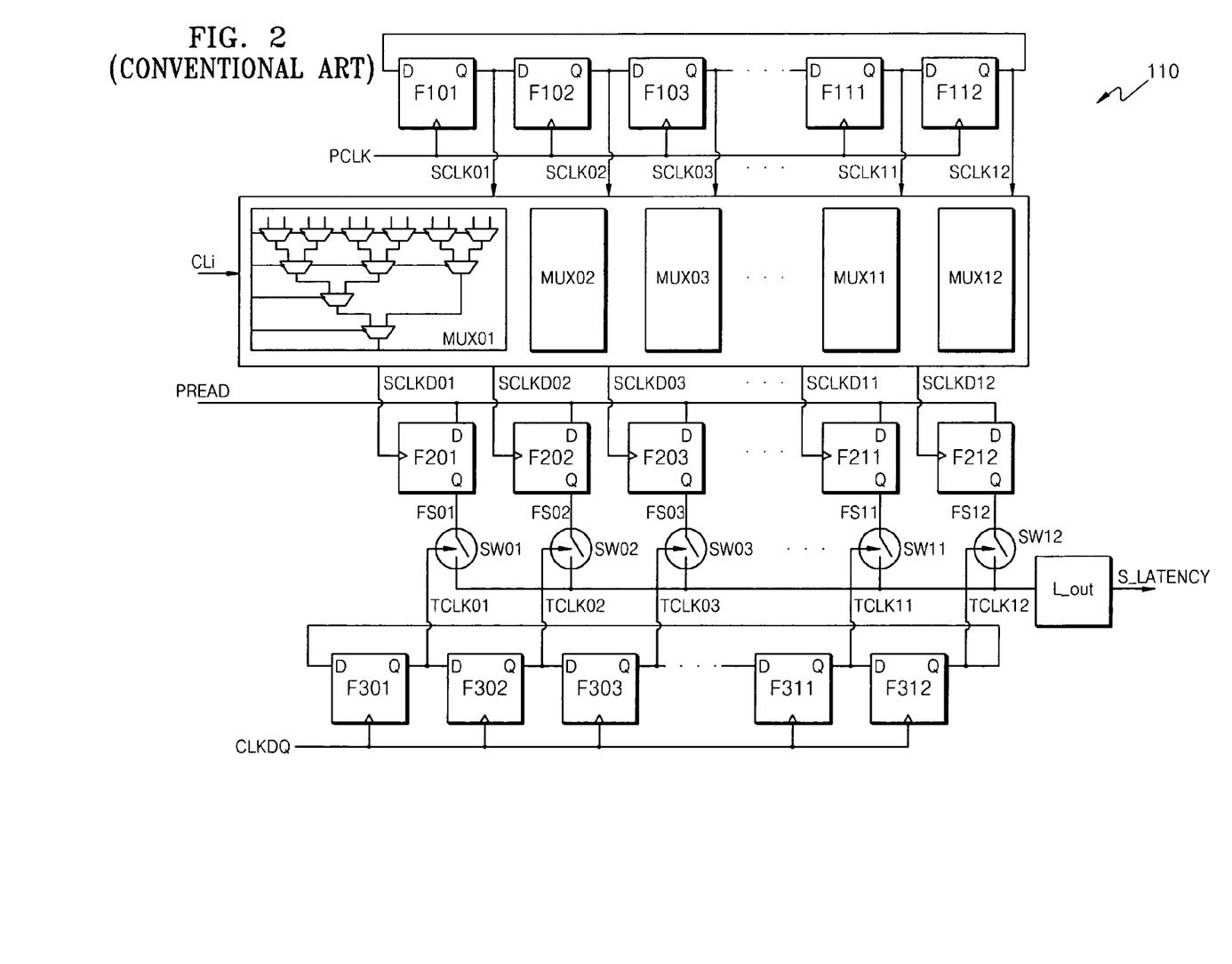
FIG. 2 is a circuit diagram illustrating the latency signal generator of FIG. 1.

FIG. 2 is a circuit diagram illustrating the latency signal generator 110 of FIG. 1. Referring to FIG. 2, the latency signal generator 110 may support 12 CAS latency modes.

Referring to FIG. 2, a plurality of flip-flops F101 through F112 may generate a plurality of sequential sampling clock signals SCLK01 through SCLK12 in response to an internal clock signal PCLK. A plurality of multiplexers MUX01 through MUX12 may respectively adjust the sequence of the plurality of sequential sampling clock signals SCLK01 through SCLK12 corresponding to the CAS latency CLi so as to output a plurality of sampling clock signals SCLKD01 through SCLKD12, respectively. A plurality of flip-flops F201 through F212 may latch an internal read command PREAD based on the plurality of sampling clock signals SCLKD01 through SCLKD12, respectively.

Referring to FIG. 2, a plurality of flip-flops F301 through F312 may generate a plurality of transfer control signals TCLK01 through TCLK12, respectively, according to a data output clock signal CLKDQ. A plurality of switches SW01 through SW12 may control the output of the plurality of flip-flops F201 through F212, respectively, in response to the plurality of transfer control signals TCLK01 through TCLK12, respectively. An output latch L_out may receive the outputs FS01 through FS12 of the plurality of flip-flops F201 through F212, respectively, which may be controlled by the plurality of switches SW01 through SW12, respectively, and may output a latency signal S_LATENCY.

Conventional operation of the latency signal generator 110 illustrated in FIG. 2 is well-known in the art and will not be described further for the sake of brevity.

Generally, as an operating speed of a conventional synchronization semiconductor memory device increases, it may become more difficult for the conventional synchronization semiconductor memory device to accommodate multiple CAS latency modes. Accordingly, the latency signal generator 110 may be configured to generate a plurality of latency signals corresponding to a given CAS latency having a given number of clock cycles.

However, in order to generate a latency signal corresponding to CAS latency having a higher value using the latency signal generator 110 having the structure as illustrated in FIG. 2, the number of flip-flops and multiplexers may scale with the number of clock cycles (e.g., the amount of delay), which may increase the circuit area of the latency signal generator 110, and may likewise increase a logic delay during latency signal generation.

SUMMARY OF EXAMPLE EMBODIMENTS

An example embodiment is directed to a latency signal generator, including a sampling clock signal generator adjusting a plurality of initial sampling clock signals based on a received clock signal to generate a plurality of adjusted sampling clock signals based on a received clock signal, a latch enable signal supply unit adjusting a plurality of initial latch enable signals based on a given one of the plurality of initial sampling clock signals to generate a plurality of adjusted latch enable signals and a latch unit including a plurality of latency latches, each of the plurality of latency latches selectively latching a given internal read command based on one of the plurality of adjusted sampling clock signals and one of the plurality of adjusted latch enable signals.

Another example embodiment is directed to a method of generating a latency signal, including adjusting a plurality of initial sampling clock signals to generate a plurality of adjusted sampling clock signals, generating a plurality of initial latch enable signals based on a given one of the plurality of initial sampling clock signals, adjusting the plurality of initial latch enable signals to generate a plurality of adjusted latch enable signals and selectively latching a given internal read command at each of a plurality of latency latches based on one of the plurality of adjusted sampling clock signals and one of the plurality of adjusted latch enable signals.

Another example embodiment is directed to a latency signal generator using M×N latency latches, and a latency signal generating method therefor, in order to reduce a circuit area and logic delay.

BRIEF DESCRIPTION OF THE DRAWINGS

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

DETAILED DESCRIPTION OF EXAMPLE EMBODIMENTS

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

Accordingly, while example embodiments are susceptible to various modifications and alternative forms, specific embodiments thereof are shown by way of example in the drawings and will herein be described in detail. It should be understood, however, that there is no intent to limit example embodiments to the particular forms disclosed, but conversely, example embodiments are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
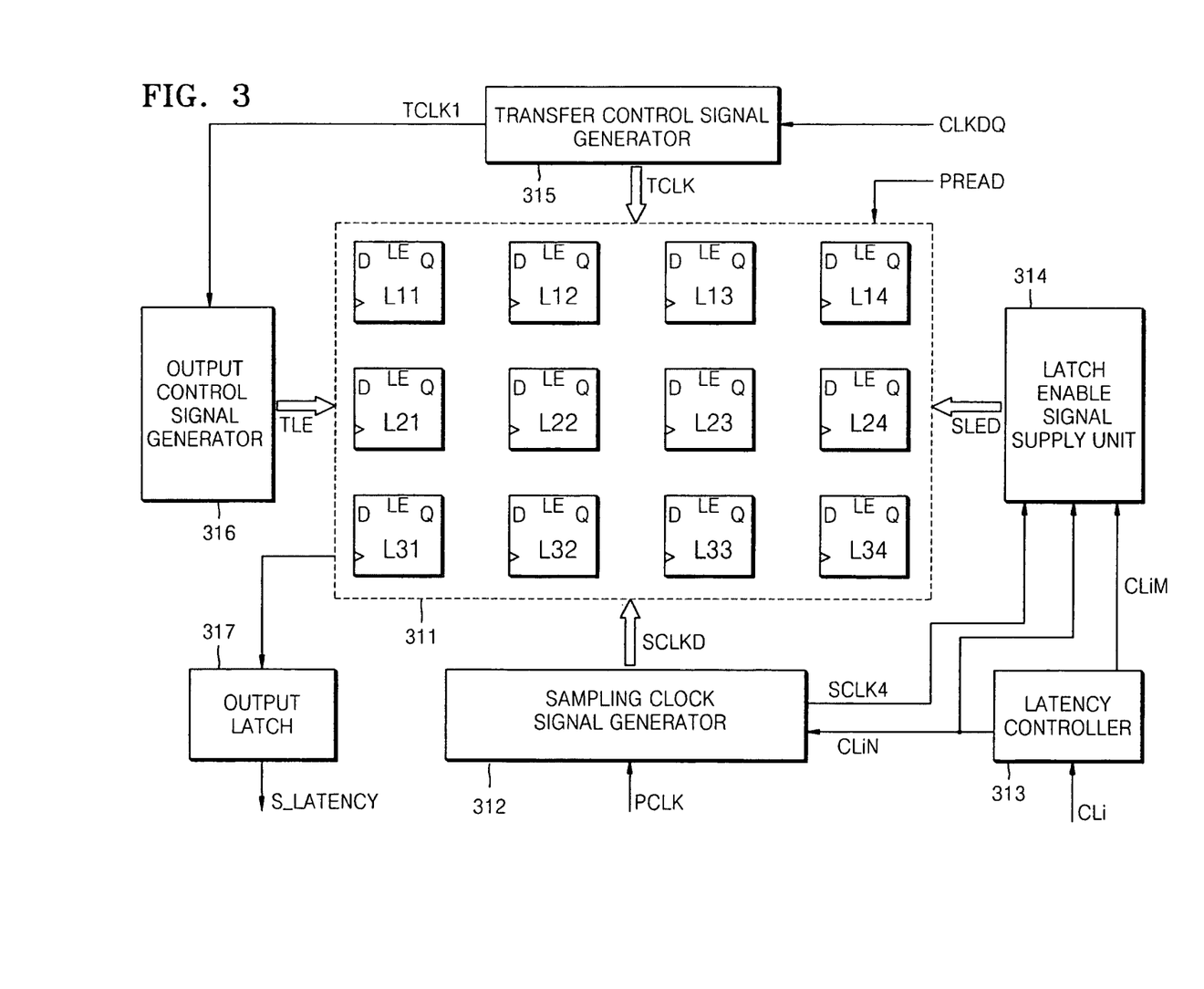
FIG. 3 is a block diagram illustrating a latency signal generator according to an example embodiment.

FIG. 3 is a block diagram illustrating a latency signal generator according to an example embodiment. In an example, the latency signal generator of FIG. 3 may support 12 CAS latency modes. However, it is understood that other example embodiments may be directed to a latency signal generator capable of supporting any number of CAS latency modes.

In the example embodiment of FIG. 3, the latency signal generator may include a MN latch unit 311 including M×N latency latches (e.g., 3×4 of L11 through L34 where M=3 and N=4, while it is understood that other examples need not be so limited), a sampling clock signal generator 312, a latency controller 313, a latch enable signal supply unit 314, a transfer control signal generator 315, an output control signal generator 316 and an output latch 317.

In the example embodiment of FIG. 3, the latency controller 313 may receive CAS latency CLi and may output a sampling selection control signal CLiN and an enable selection control signal CLiM corresponding to the CAS latency CLi. An example of the latency controller 313 will be described with reference to FIGS. 4A and 4B below.

Figure 4A:
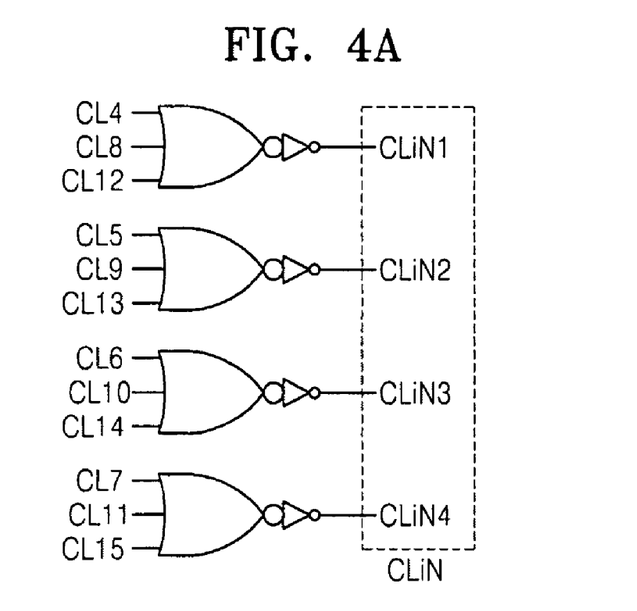
FIGS. 4A and 4B illustrate a latency controller according to an example embodiment.
Figure 4B:
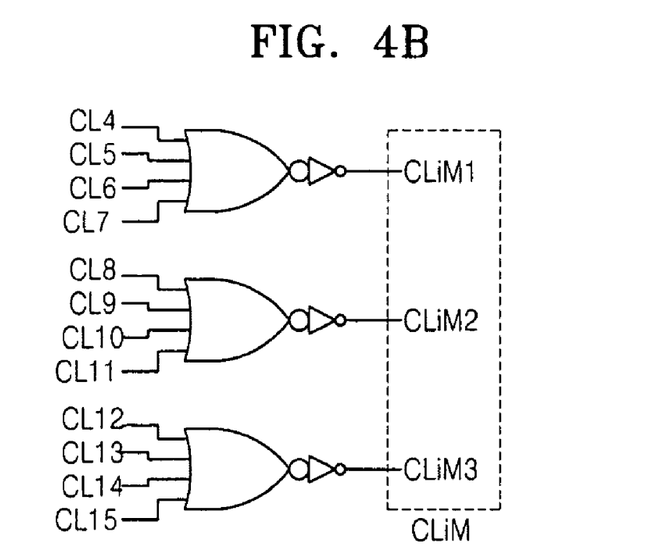

FIGS. 4A and 4B illustrate the latency controller 313 of FIG. 3 according to an example embodiment.

In the example embodiment of FIGS. 4A and 4B, the latency controller 313 may receive CAS latency CLi from a mode register. In order to generate a sampling selection control signal CLiN, the latency controller 313 may include 4 OR gates, as illustrated in FIG. 4A, wherein each OR gate may include a NOR gate and an inverter. However, it is understood that the number of OR gates need not be limited to 4, and other example embodiments may include any number of OR gates. In the example, each OR gate may include 3 input terminals and may output each bit (CLiN1 through CLiN4) of the sampling selection control signal CLiN through an output terminal. However, it is understood that the number of input terminals of each OR gate need not be limited to 3, and other example embodiments may include any number of input terminals within each respective OR gate.

In the example embodiment of FIGS. 4A and 4B, in order to generate the enable selection control signal CLiM, the latency controller 313 may include 3 OR gates, as illustrated in FIG. 4B. However, it is understood that the number of OR gates need not be limited to 3, and other example embodiments may include any number of OR gates. Each OR gate may include 4 input terminals and may output each bit (CLiM1 through CLiM3) of the enable selection control signal CLiM through an output terminal. However, it is understood that the number of input terminals of each OR gate need not be limited to 4, and other example embodiments may include any number of input terminals within each respective OR gate.

In the example embodiment of FIGS. 4A and 4B, in an example, if the latency signal generator is configured to support 12 CAS latency modes of CL4 through CL15, and if CAS latency CLi is 4, the sampling selection control signal CLiN may become "1000" and the enable selection control signal CLiM may become "100". In another example, if the CAS latency CLi is 5, the sampling selection control signal CLiN may become "0100" and the enable selection control signal CLiM may become "100". Likewise, in another example, if the CAS latency CLi is 15, the sampling selection control signal CLiN may become "0001" and the enable selection control signal CLiM may become "001".

Figure 5:
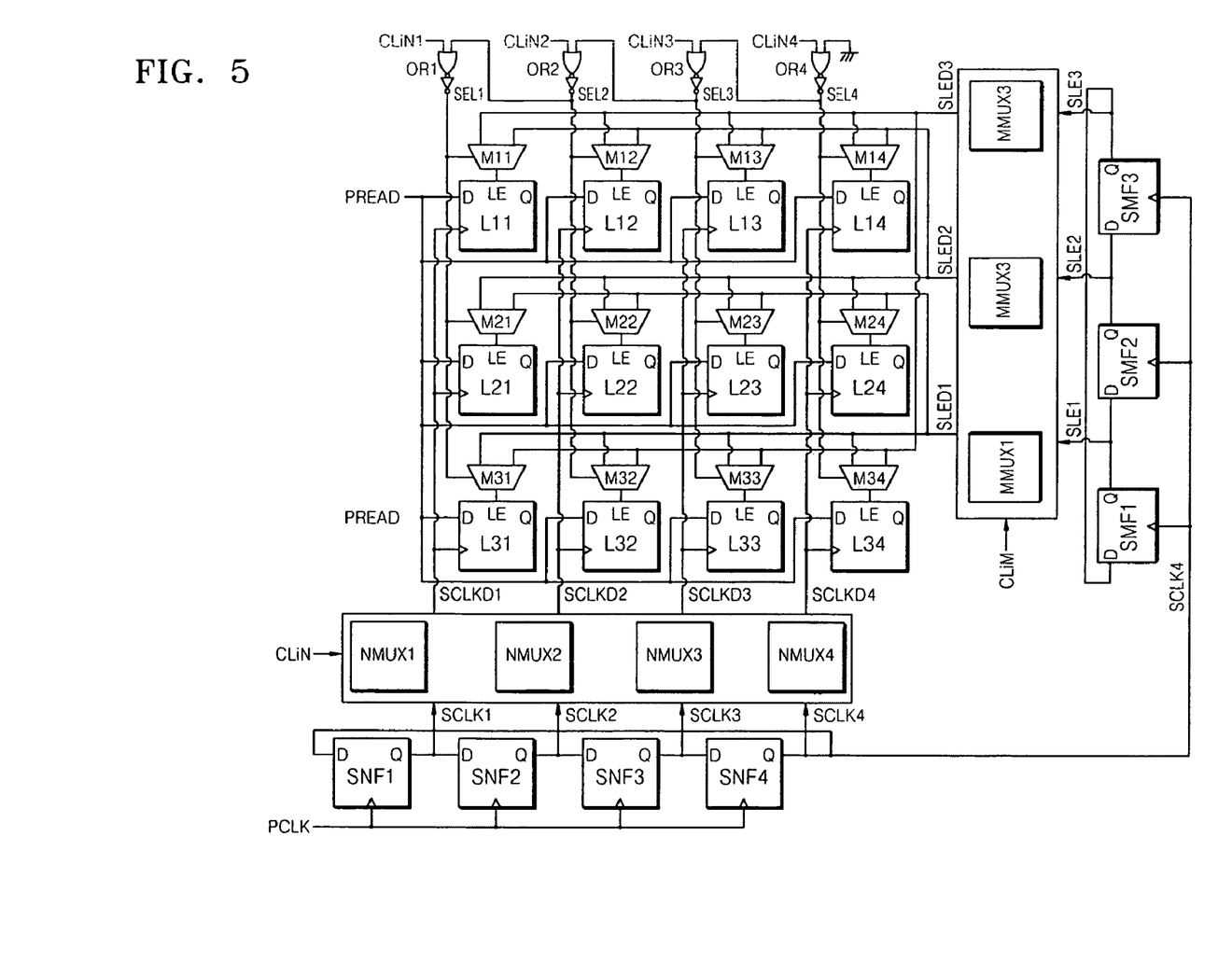
FIG. 5 illustrates a sampling clock signal generator, a latch enable signal supply unit, and a latch unit according to an example embodiment.

Returning to the example embodiment of FIG. 3, the sampling clock signal generator 312 may receive an internal clock signal PCLK, may generate 4 sequential sampling clock signals (e.g., SCLK1 through SCLK4 as shown in FIG. 5, discussed below in greater detail), may adjust the sequence of the 4 sequential sampling clock signals SCLK1 through SCLK4 in accordance with the sampling selection control signal CLiN, and may output 4 sampling clock signals (e.g., SCLKD1 through SCLKD4 as shown in FIG. 5, discussed below in greater detail). However, it is understood that the numbers of the sequential sampling clock signals and the sampling clock signals need not be limited to 4 in other example embodiments.

In the example embodiment of FIG. 3, the latch enable signal supply unit 314 may receive a sampling clock signal (e.g., SCLK4 in FIGS. 3 and 5, discussed below in greater detail) of the 4 sequential sampling clock signals SCLK1 through SCLK4, may generate 3 sequential latch enable signals (e.g., SLE1 through SLE3 in FIG. 5, discussed below in greater detail), may adjust the sequence of the 3 sequential latch enable signals SLE1 through SLE3 in accordance with the enable selection control signal CLiM, and may output 3 latch enable signals (e.g., SLED1 through SLED3 in FIG. 5, discussed below in greater detail). However, it is understood that the numbers of the sequential latch enable signals and the latch enable signals need not be limited to 3 in other example embodiments.

Hereinafter, example operation of the sampling clock signal generator 312, the latch enable signal supply unit 314, and the MN latch unit 311 will be described with reference to FIG. 5.

FIG. 5 illustrates the sampling clock signal generator 312, the latch enable signal supply unit 314, and the MN latch unit 311 of FIG. 3 according to an example embodiment.

In the example embodiment of FIG. 5, shift registers SNF1 through SNF4 and multiplexers NMUX1 through NMUX4 may collectively constitute or correspond to the sampling clock signal generator 312 illustrated in FIG. 3. Shift registers SMF1 through SMF3, first multiplexers MMUX1 through MMUX3, second multiplexers M11 through M34, and a selection controller illustrated in FIG. 5 may collectively constitute or correspond to the latch enable signal supply unit 314 illustrated in FIG. 3. Latency latches L11 through L34 illustrated in FIG. 5 may collectively constitute or correspond to the MN latch unit 311 illustrated in FIG. 3.

In the example embodiment of FIG. 5, the sampling clock signal generator 312 may include the shift registers SNF1 through SNF4 and the multiplexers NMUX1 through NMUX4. The shift registers SNF1 through SNF4 may 11 receive an internal clock signal PCLK and may generate 4 sequential sampling clock signals SCLK1 through SCLK4. The multiplexers NMUX1 through NMUX4 may adjust the sequence of the 4 sequential sampling clock signals SCLK1 through SCLK4 in accordance with a sampling selection control signal CLiN, and may output 4 sequential sampling clock signals SCLKD1 through SCLKD4.

Figure 6A:
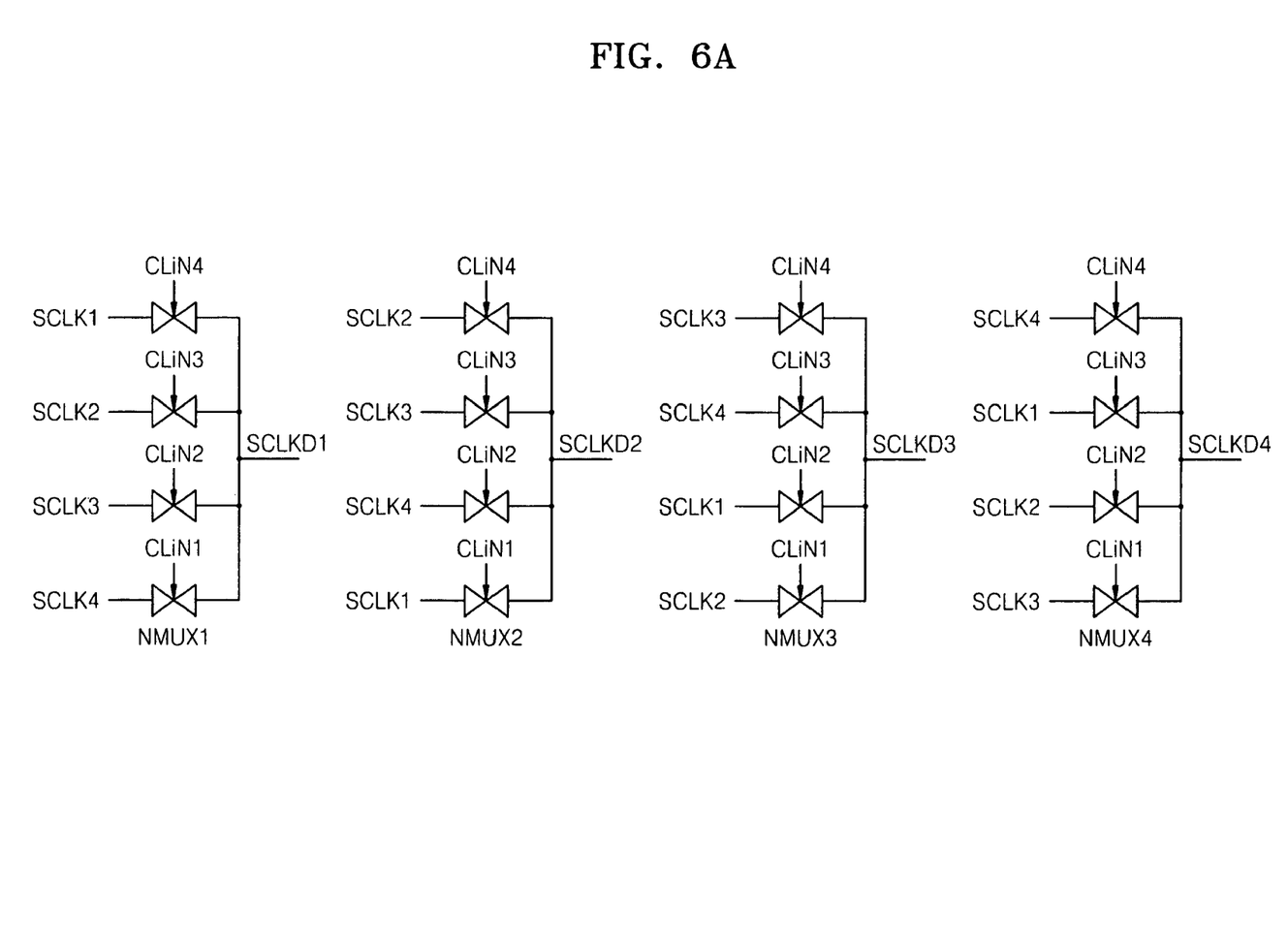
FIG. 6A illustrates multiplexers according to an example embodiment.

FIG. 6A illustrates the multiplexers NMUX1 through NMUX4 of FIG. 5 according to an example embodiment.

In the example embodiment of FIG. 6A, first through fourth multiplexers NMUX1 through NMUX4 may output first through fourth sampling clock signals SCLKD1 through SCLKD4, respectively, in response to sampling selection control signals CLiN1 through CLiN4.

In the example embodiments of FIG. 5, as described above, the latch enable signal supply unit illustrated in FIG. 5 may include the shift registers SMF1 through SMF3, the first multiplexers MMUX1 through MMUX3, the second multiplexers M11 through M34 and the selection controller. The shift registers SMF1 through SMF3 may receive a fourth sequential sampling clock signal SCLK4 of the first through fourth sequential sampling clock signals SCLK1 through SCLK4, and may generate 3 sequential latch enable signals SLE1 through SLE3. The first multiplexers MMUX1 through MMUX3 may adjust the sequence of the 3 sequential latch enable signals SLE1 through SLE3 in accordance with an enable selection control signal CLiM, and may output 3 latch enable signals SLED1 through SLED3.

Figure 6B:
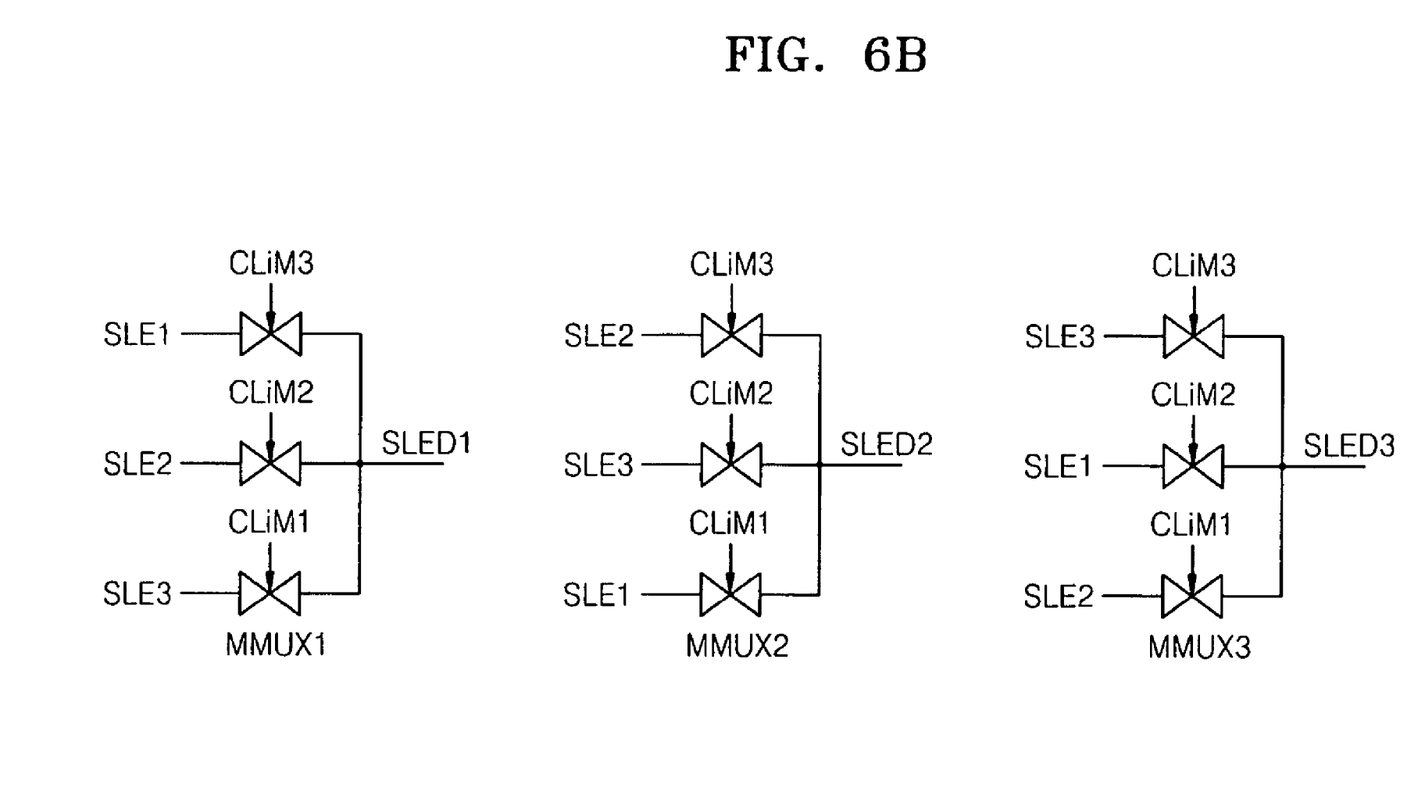
FIG. 6B illustrates multiplexers according to another example embodiment.

FIG. 6B illustrates the first multiplexers MMUX1 through MMUX3 of FIG. 5 according to an example embodiment.

In the example embodiment of FIG. 6B, the first multiplexers MMUX1 through MMUX3 may output 3 sequential latch enable signals first through third latch enable signals SLED1 through SLED3, respectively, in response to enable control signals CLiM1 through CLiM3. In an example, the second multiplexers M11 through M34 illustrated in FIG. 5 may include 3×4 enable multiplexers M11 through M34. Each of the 3×4 enable multiplexers M11 through M34 may receive at least two latch enable signals of the 3 latch enable signals SLED1 through SLED3, and may output one of the at least two latch enable signals to the corresponding latency latch.

Returning to the example embodiment of FIG. 5, the selection controller may receive sampling selection control signals CLiN1 through CLiN4, may generate 4 selection signals SEL1 through SEL4, and may output the 4 selection signals SEL1 through SEL4 to the enable multiplexers of the corresponding column. Each of the 4 selection signals SEL1 through SEL4 may control the outputs of the enable multiplexers of the corresponding column. For example, the first selection signal SEL1 may control the outputs of the enable multiplexers M11, M21, and M31 of the first column.

In the example embodiment of FIG. 5, the selection controller may include first OR gate OR1 through fourth OR gate OR4. The first OR gate OR1 may receive a first bit CLiN1 of the sampling selection control signal CLiN through one input terminal, and may output a first selection signal SEL1 to the enable multiplexers of a first column (M11, M21, M31). Similarly, the fourth OR gate OR4 may receive a first bit CLiN4 of the sampling selection control signal CLiN through one input terminal, and may output a fourth selection signal SEL4 to the enable multiplexers of a fourth column (M14, M24, M34). The other input terminal of a k-th OR gate (k=1, 2, and 3) may be connected to an output terminal of a (k+1)-th OR gate, and the other input terminal of the fourth OR gate OR4 may be connected to a ground voltage.

In the example embodiments of FIGS. 3 and 5, the MN latch unit 311 of FIG. 3 may include the 3×4 latency latches L11 through L34. Each of the 3×4 latency latches L11 through L34 may include an input terminal D, an output terminal Q, a clock input terminal and an enable terminal LE.

In the example embodiment of FIG. 5, each of the latency latches L11 through L34 may latch an internal read command PREAD received through an input terminal D, in response to a latch enable signal received through an enable terminal LE and a sampling clock signal received through a clock input terminal. For example, each of the latency latches L11 through L34 may latch an internal read command PREAD received through an input terminal D, in response to a rising edge of a sampling clock signal received through a clock input terminal if a latch enable signal received through an enable terminal LE is set to a first logic level (e.g., a higher logic level or logic "1"). A given sampling clock signal and a given latch enable signal may be applied to a given latency latch in response to the sampling selection control signal CLiN and the enable selection control signal CLiM. If the internal read command PREAD is latched by a latency latch corresponding to CAS latency CLi among the latency latches L11 through L34, the first logic level (e.g., a higher logic level or logic "1") may be latched by a latency latch corresponding to the CAS latency CLi among the latency latches L11 through L34 and a second logic level (e.g., a lower logic level or logic "0") may be latched by the remaining latency latches.

Hereinafter, a process in which the internal read command PREAD illustrated in FIGS. 3 and 5 is latched by the latency latches L11 through L34 will be described with reference to FIG. 7.

Figure 7:
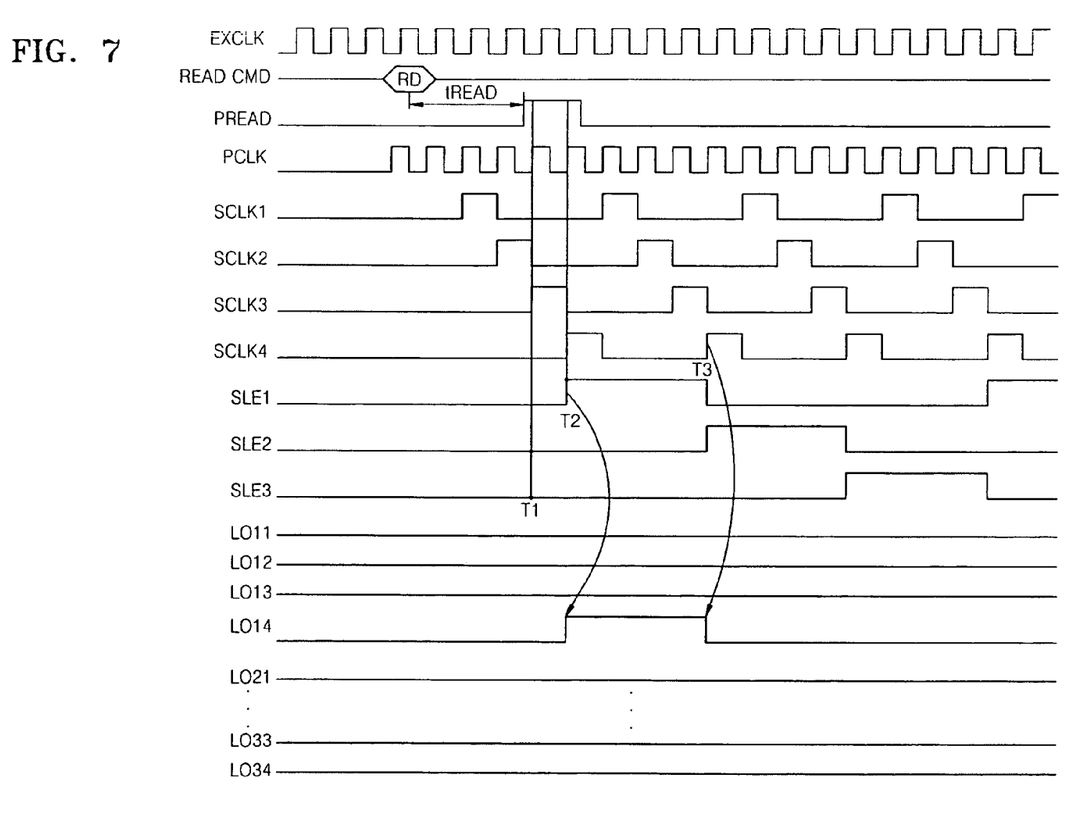
FIG. 7 illustrates timing diagrams of signals associated with example structure of FIG. 5 according to an example embodiment.

FIG. 7 illustrates timing diagrams of signals associated with example structure of FIG. 5 according to an example embodiment.

In the example embodiment of FIG. 7, the timing diagram may illustrate an external clock signal EXCLK, a read command READ CMD, an internal read command PREAD generated if a time period tREAD elapses after a read command RD is applied, an internal clock signal PCLK, 4 sequential sampling clock signals SCLK1 through SCLK4, and 3 sequential latch enable signals SLE1 through SLE3. Also, L011 through L034 denoted in FIG. 7 may represent values latched by the latency latches L11 through L34, respectively.

An example will now be described where an internal read command PREAD is latched by the latency latch L14.

In the example embodiment of FIG. 7, if a fourth sequential sampling clock signal SCLK4 is applied as a fourth sampling clock signal SCLKD4 to the latency latch L14 in response to a sampling selection control signal CLiN, and a first sequential latch enable signal SLE1 is applied as a third latch enable signal SLED3 to the latency latch L14 in response to an enable selection control signal CLiM, an internal read command PREAD set to the first logic level (e.g., a higher logic level or logic "1") may be latched by the latency latch L14 at a rising edge timing T2 of the fourth sampling clock signal SCLKD4 (e.g., corresponding to SCLK4 of FIG. 7). The internal read command PREAD may be set to the first logic level at a rising edge timing T1 of the third sequential sampling clock signal SCLK3 (e.g., corresponding to an arbitrary sampling clock signal). However, because the timing T1 does not belong to a period in which a sequential latch enable signal SLE1 through SLE3 (e.g., corresponding to an arbitrary latch enable signal) is set to the first logic level (e.g., a higher logic level or logic "1"), the first logic level may not necessarily be latched by a latency latch. At a rising edge timing T3 of the fourth sampling clock signal SCLKD4 (e.g., corresponding to SCLK4 of FIG. 7), the first logic level latched by the latency latch L14 may transition to the second logic level (e.g., a lower logic level or logic "0"). Second logic levels for L011 through L013 and L021 through L034 may be latched by the latency latches L11 through L13 and L21 through L34, except for the latency latch L14, as illustrated in FIG. 7.

Returning to the example embodiment of FIG. 3, the transfer control signal generator 315 may control the outputs of the latency latches L11 through L34, based on 4 transfer control signals TCLK1 through TCLK4 (e.g., see FIG. 8, discussed below, for more detail) generated from a data output clock signal CLKDQ.

Figure 8:
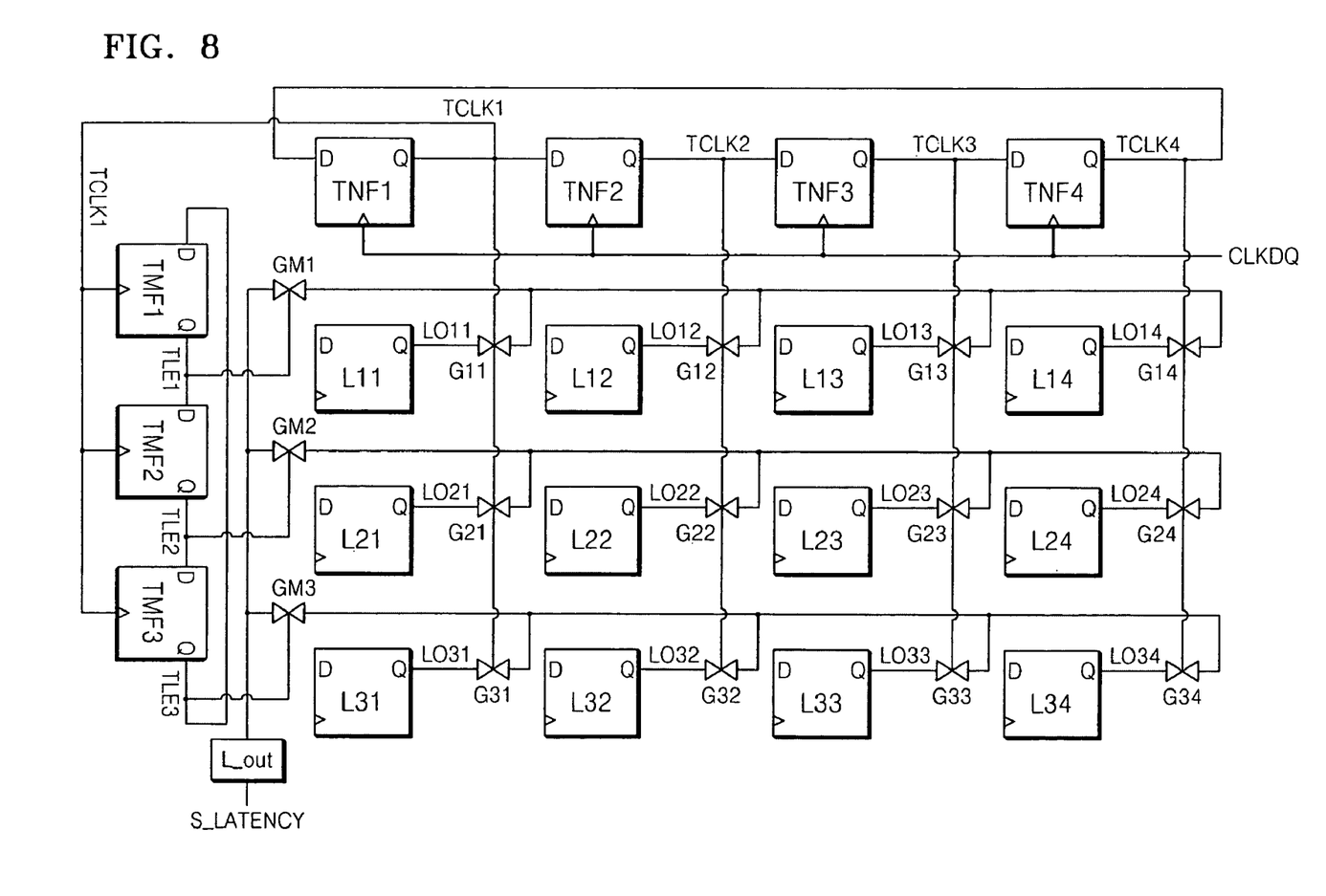
FIG. 8 illustrates a latch unit, a transfer control signal generator, an output control signal generator and an output latch according to an example embodiment.

In the example embodiments of FIGS. 3 and 8, the output control signal generator 316 may receive a transfer control signal (e.g., TCLK1) of 4 transfer control signals TCLK1 through TCLK4, may generate 3 output control signals TLE1 through TLE3, and may control the outputs of the latency latches L11 through L34 in a row unit according to the M output control signals TLE1 through TLE3.

Hereinafter, example operation of the transfer control signal generator 315, the output control signal generator 316, and the output latch 317 will be described in greater detail with reference to FIG. 8.

FIG. 8 illustrates the MN latch unit 311, the transfer control signal generator 315, the output control signal generator 316, and the output latch 317 of FIG. 3 according to an example embodiment. In the example embodiment of FIG. 8, L11 through L34 may collectively constitute or correspond to the MN latch unit 311 illustrated in FIG. 3, and TNF1 through TNF4 and G11 through G34 may collectively constitute or correspond to the transfer control signal generator 315 illustrated in FIG. 3. Also, TMF1 through TMF3 and GM1 through GM3 may collectively constitute or correspond to the output control signal generator 316 illustrated in FIG. 3, and L_out may constitute or correspond to the output latch 317 illustrated in FIG. 3.

Accordingly, in the example embodiment of FIG. 8, the transfer control signal generator may include shift registers TNF1 through TNF4 and 3×4 transfer switches G11 through G34. The shift registers TNF1 through TNF4 may receive a data output clock signal CLKDQ and may generate 4 transfer control signals TCLK1 through TCLK4. The 3×4 transfer switches G11 through G34 may control the outputs of the 3×4 latency latches L11 through L34 in a unit of a column, in response to the 4 transfer control signals TCLK1 through TCLK4.

In the example embodiment of FIG. 8, the shift registers TNF1 through TNF4 may receive a data output clock signal CLKDQ from a DLL. In an example, the data output clock signal CLKDQ may correspond to a clock signal generated from an external clock signal EXCLK by the DLL.

In the example embodiment of FIG. 8, the output control signal generator illustrated in FIG. 8 may include the shift registers TMF1 through TMF3 and the output switches GM1 through GM3. The shift registers TMF1 through TMF3 may receive a first transfer control signal TCLK1 of the first through fourth transfer control signals TCLK1 through TCLK4, and may generate 3 output control signals TLE1 through TLE3. Also, the output switches GM1 through GM3 may include first through third transfer switches GM1 through GM3 for controlling the outputs of the latency latches L11 through L34 of the first through third columns, respectively, in response to the first through third output control signals TLE1 through TLE3.

In the example embodiment of FIG. 8, the output latch L_out may sequentially receive the outputs of the latency latches L11 through L34, which may be respectively controlled by the M output control signals TLE1 through TLE3 and the 4 transfer control signals TCLK1 through TCLK4, and may generate a latency signal S_LATENCY.

Hereinafter, a process in which the latency signal S_LATENCY is generated from the outputs of the latency latches L11 through L34 is described with reference to FIG. 9.

Figure 9:
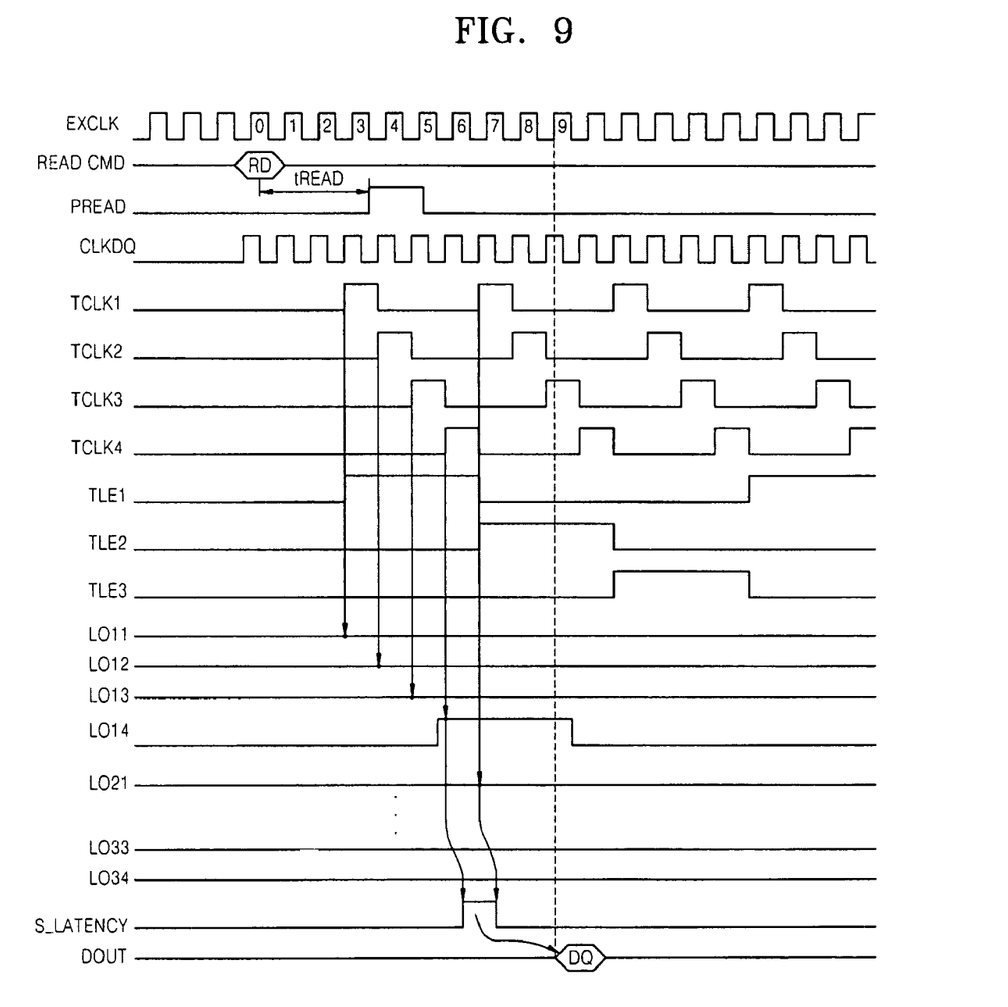
FIG. 9 illustrates timing diagrams of signals associated with example structure of FIG. 8 according to an example embodiment.

FIG. 9 illustrates timing diagrams of signals associated with example structure of FIG. 8 according to an example embodiment.

In the example embodiment of FIG. 9, the timing diagram may illustrate an external clock signal EXCLK, a read command READ CMD, an internal read command PREAD generated if a time period tREAD elapses after a read command RD is applied, a data output clock signal CLKDQ, 4 transfer control signals TCLK1 through TCLK4, 3 output control signals TLE1 through TLE3, outputs LO11 through LO34 of the latency latches L11 through L34, a latency signal S_LATENCY, and output data DOUT. In the example embodiment of FIG. 9, the respective outputs LO11 through LO34 of the latency latches L11 through L34 may correspond to values LO11 through LO34 latched by the latency latches L11 through L34 illustrated in FIG. 7.

In the example embodiment of FIG. 9, if the first output control signal TLE1 is set to the first logic level (e.g., a higher logic level or logic "1"), the transfer switches G11 through G14 illustrated in FIG. 8 may be sequentially turned on, and values latched by the latency latches L11 through L14 may be sequentially output. If the second output control signal TLE2 is set to the first logic level (e.g., a higher logic level or logic "1"), the transfer switches G21 through G24 illustrated in FIG. 8 may be sequentially turned on, and values latched by the latency latches L21 through L24 may be sequentially output. If the third output control signal TLE3 is set to the first logic level (e.g., a higher logic level or logic "1"), the transfer switches G31 through G34 illustrated in FIG. 8 may be sequentially turned on, and values latched by the latency latches L31 through L34 may be sequentially output. Accordingly, a latency signal S_LATENCY as illustrated in FIG. 9 may be generated. A data output buffer may output output data DQ to an external entity in response to the latency signal S_LATENCY.

In the example embodiment of FIG. 9, a latency signal generator including 3×4 latency latches for supporting 12 CAS latency modes has been described above. However, it is understood that other example embodiments may be directed to any type of latency signal generator. For example, in another example embodiment, in order to support 20 CAS latency modes, the latency signal generator may include 4×5 latency latches.

In another example, a latency signal generator having a structure as illustrated in the example embodiment of FIG. 3 may be configured to include fewer flip-flops, latches and/or multiplexers as compared to the conventional latency signal generator as illustrated in FIG. 2 (e.g., even though the number of latency latches L11 through L34 illustrated in FIG. 3 is equal to the number of the flip-flops F201 through F212 illustrated in FIG. 2). For example, referring to conventional FIG. 2, 12 12:1 multiplexers MUX01 through MUX12 may be included, wherein each 12:1 multiplexer consists of 11 2:1 multiplexers. However, in the example embodiment of FIG. 3, 4 4:1 multiplexers NMUX1 through NMUX4, 3 3:1 multiplexers MMUX1 through MMUX3, and 12 2:1 multiplexers M11 through M34 may be included. Accordingly, because the latency signal generator may include fewer flip-flops, latches and/or multiplexers, a circuit area of the example latency signal generator and corresponding logic delay (e.g., propagation/processing delay) may be reduced.

An example method of generating a latency signal using 3×4 latency latches will now be described in greater detail.

In example latency signal generation, referring to FIGS. 3 through 9, 4 sequential sampling clock signals SCLK1 through SCLK4 may be generated from an internal clock signal PCLK and the sequence of the 4 sequential sampling clock signals SCLK1 through SCLK4 may be adjusted in correspondence to CAS latency, in order to output 4 sampling clock signals SCLKD1 through SCLKD4.

In example latency signal generation, referring to FIGS. 3 through 9, 3 sequential latch enable signals SLE1 through SLE3 may be generated from a sequential sampling clock signal (e.g., SCLK4) among the first through fourth sequential sampling clock signals SCLK1 through SCLK4, and the sequence of the 3 latch enable signals SLE1 through SLE3 may be adjusted in correspondence to CAS latency, so as to output 3 latch enable signals SLED1 through SLED3. An internal read command PREAD may be latched in the latency latches L11 through L34, according to the 4 sampling clock signals SCLKD1 through SCLKD4 and the 3 latch enable signals SLED1 through SLED3. For example, each of the latency latches L11 through L34 may latch an internal read command PREAD (e.g., which may be received in response to a rising edge of a sampling clock signal) while a latch enable signal received is set to the first logic level (e.g., a higher logic level or logic "1").

In example latency signal generation, referring to FIGS. 3 through 9, the latency latch may receive a sampling clock signal and a latch enable signal corresponding to a CAS latency CLi, and thus, the internal read command PREAD may be latched in a latency latch corresponding to the CAS latency CLi among 3×4 latency latches L11 through L34. In an example, the first logic level (e.g., a higher logic level or logic "1") may be latched in the latency latch corresponding to the CAS latency CLi among the latency latches L11 through L34, and the second logic level (e.g., a lower logic level or logic "0") may be latched in the remaining latency latches.

In example latency signal generation, referring to FIGS. 3 through 9, 4 transfer control signals TCLK1 through TCLK4 may be generated from a data output clock signal CLKDQ, and the outputs of the latency latches L11 through L34 may be controlled in a column unit according to the 4 transfer control signals TCLK1 through TCLK4. 3 output control signals TLE1 through TLE3 may be generated from a transfer control signal (e.g., TCLK1) of the first through fourth transfer control signals TCLK1 through TCLK4, and the outputs of the latency latches L11 through L34 may be controlled in a row unit according to the 3 output control signals TLE1 through TLE3. The outputs LO11 through LO34 of the latency latches L11 through L34, which may be respectively controlled according to the 4 transfer control signals TCLK1 through TCLK4 and the 3 output control signals TLE1 through TLE3, may be sequentially received so that a latency signal S_LATENCY may be generated.

Another example method of generating a latency signal using 3×4 latency latches will now be described in greater detail.

In example latency signal generation using 3×4 latches, referring to FIGS. 3 through 9, 4 sampling clock signals SCLKD1 through SCLKD4 and 3 latch enable signals SLED1 through SLED3 may be generated from an internal clock signal PCLK. The sequence of the 4 sampling clock signals and the sequence of the 3 latch enable signals may correspond to CAS latency CLi. An internal read command PREAD may be latched in a latency latch corresponding to the CAS latency CLi among 3×4 latency latches L11 through L34, according to the 4 sampling clock signals SCLKD1 through SCLKD4 and the 3 latch enable signals SLED1 through SLED3. 4 transfer control signals TCLK1 through TCLK4 and 3 output control signals TLE1 through TLE3 may be generated from a data output clock signal CLKDQ. The outputs LO11 through LO34 of the latency latches L11 through L34 may be controlled in a column unit according to the 4 transfer control signals TCLK1 through TCLK4, and the outputs LO11 through LO34 of the latency latches L11 through L34 may be controlled in a row unit according to the 3 output control signals TLE1 through TLE3. A latency signal S_LATENCY may be generated from the outputs LO11 through LO34 of the latency latches L11 through L34 (e.g., which may be sequentially output).

In another example embodiment, because the latency signal generator may include fewer flip-flops, latches and/or multiplexers as compared to conventional latency signal generators, a circuit area of the example latency signal generator and/or a logic delay (e.g., processing delay, propagation delay, etc.) may be reduced during latency signal generation.

Example embodiments being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A latency signal generator, comprising:
   a sampling clock signal generator configured to adjust a plurality of initial sampling clock signals based on a received clock signal to generate a plurality of adjusted sampling clock signals;
   a latch enable signal supply unit configured to adjust a plurality of initial latch enable signals based on a given one of the plurality of initial sampling clock signals to generate a plurality of adjusted latch enable signals; and
   a latch unit including a plurality of latency latches, each of the plurality of latency latches configured to selectively latch a given internal read command based on one of the plurality of adjusted sampling clock signals and one of the plurality of adjusted latch enable signals.

2. The latency signal generator of claim 1, wherein a signal set includes a given adjusted sampling clock signal from among the plurality of adjusted sampling clock signals and a given adjusted latch enable signal from among the plurality of adjusted latch enable signals, and each of the plurality of latency latches selectively latches the given internal read command based on a different signal set.

3. The latency signal generator of claim 1, further comprising:
   a latency controller receiving CAS latency information and outputting a sampling selection control signal and an enable selection control signal corresponding to the CAS latency information;
   a transfer control signal generator controlling the outputs of the latency latches based on a plurality of transfer control signals generated from a data output clock signal;
   an output control signal generator receiving one of the plurality of transfer control signals, generating a plurality of output control signals, and controlling the outputs of the latency latches in a row unit based on the plurality of output control signals;
   an output latch generating a latency signal based on one or more outputs of the plurality of latency latches,
   wherein the received clock signal is an internal clock signal and the sampling clock signal generator adjusts the plurality of initial sampling clock signals based on the sampling selection control signal to generate the plurality of adjusted sampling clock signals, and
   the latch enable signal supply unit adjusts the plurality of initial latch enable signals based on the enable selection control signal to generate the plurality of adjusted latch enable signals.

4. The latency signal generator of claim 3, wherein the plurality of adjusted sampling clock signals number N, the plurality of adjusted latch enable signals number M, and the plurality of latency latches number (M×N).

5. The latency signal generator of claim 4, wherein the latency controller includes:
   N OR gates, each of the N OR gates including M input terminals and generating respective bits of the sampling selection control signal; and
   M OR gates, each of the M OR gates including N input terminals and generating respective bits of the enable selection control signal.

6. The latency signal generator of claim 3, wherein the latency controller includes:
   a first plurality of OR gates, each of the first plurality of OR gates receiving the CAS latency information and generating respective bits of the sampling selection control signal; and
   a second plurality of OR gates, each of the second plurality of OR gates receiving the CAS latency information and generating respective bits of the enable selection control signal.

7. The latency signal generator of claim 3, wherein the sampling clock signal generator includes:
   a shift register unit receiving the internal clock signal and generating the plurality of initial sampling clock signals; and
   a multiplexer unit adjusting the sequence of the plurality of initial sampling clock signals based on the sampling selection control signal to output the plurality of adjusted sampling clock signals.

8. The latency signal generator of claim 7, wherein the multiplexer unit includes:
   a first multiplexer outputting one of the plurality of initial sampling clock signals as a first adjusted sampling clock signal, in response to the sampling selection control signal.

9. The latency signal generator of claim 8, wherein the multiplexer unit further includes:
   at least one additional multiplexer, each of the at least one additional multiplexer outputting a given initial sampling clock signal from among the plurality of initial sampling clock signals as a corresponding adjusted sampling clock signal of the plurality of adjusted sampling clock signals, in response to the sampling selection control signal.

10. The latency signal generator of claim 3, wherein the transfer control signal generator includes:
a shift register unit receiving the data output clock signal and generating the plurality of transfer control signals; and
a plurality of transfer switches controlling the outputs of the plurality of latency latches in a column unit, in response to the plurality of transfer control signals.

11. The latency signal generator of claim 3, wherein the received one of the plurality of transfer control signals at the output control signal generator is a first of the plurality of transfer control signals.

12. The latency signal generator of claim 11, wherein the output control signal generator includes:
a shift register unit receiving the first transfer control signal and generating the plurality of output control signals; and
an output switch unit including a first transfer switch controlling the outputs of latency latches of a first row, in response to a first output control signal of the plurality of output control signals, and at least one additional transfer switch controlling the outputs of latency latches of at least one additional row, in response to at least one additional output control signal of the plurality of output control signals.

13. The latency signal generator of claim 3, wherein the CAS latency information is transmitted from a mode register to the latency controller.

14. The latency signal generator of claim 3, wherein the data output clock signal is a clock signal generated from an external clock signal by a delay locked loop (DLL).

15. The latency signal generator of claim 1, wherein the latch enable signal supply unit includes:
a shift register unit receiving the given one initial sampling clock signal and generating the plurality of initial latch enable signals;
a first multiplexer unit adjusting the sequence of the plurality of initial latch enable signals based on the enable selection control signal to generate the plurality of adjusted latch enable signals;
a second multiplexer unit including a plurality of enable multiplexers, each of the plurality of enable multiplexers receiving at least two adjusted latch enable signals from among the plurality of adjusted latch enable signals, and outputting one of the at least two adjusted latch enable signals to a corresponding latency latch; and
a selection controller receiving the sampling selection control signal, generating a plurality of selection signals, outputting the plurality of selection signals to enable multiplexers of a corresponding column, and controlling the enable multiplexers such that the outputted one of the at least two adjusted latch enable signals is output to the corresponding latency latch.

16. The latency signal generator of claim 15, wherein the first multiplexer unit includes:
a first multiplexer outputting one of the plurality of initial latch enable signals as a first adjusted latch enable signal, in response to the enable selection control signal.

17. The latency signal generator of claim 16, wherein the first multiplexer unit further includes:
at least one additional multiplexer, each of the at least one additional multiplexer outputting a given initial latch enable signal from among the plurality of initial latch enable signals as a corresponding adjusted latch enable signal of the plurality of adjusted latch enable signals, in response to the enable selection control signal.

18. The latency signal generator of claim 15, wherein the selection controller includes:
a first OR gate receiving a first bit of the sampling selection control signal through a first input terminal of the first OR gate and outputting a first selection signal of the plurality of selection signals to enable multiplexers of a first column.

19. The latency signal generator of claim 18, wherein the selection controller further includes:
at least one additional OR gate receiving at least one additional bit of the sampling selection control signal through a first input terminal of the at least one additional OR gate and outputting at least one additional selection signal of the plurality of selection signals to enable multiplexers of at least one additional column,
and wherein a second input terminal of a given OR gate is connected to an output terminal of another given OR gate, and
a second input terminal of the last one additional OR gate is connected to a ground voltage.

20. The latency signal generator of claim 1, wherein each of the plurality of latency latches latches the given internal read command, in response to a rising edge of a given adjusted sampling clock signal received while a given adjusted latch enable signal received is set to a given logic level.

21. A method of generating a latency signal, comprising
adjusting, by a sampling clock signal generator, a plurality of initial sampling clock signals to generate a plurality of adjusted sampling clock signals;
generating. by a latch enable signal supply unit. a plurality of initial latch enable signals based on a given one of the plurality of initial sampling clock signals;
adjusting, by the latch enable signal supply unit. the plurality of initial latch enable signals to generate a plurality of adjusted latch enable signals; and
selectively, by a latch unit, latching a given internal read command at each of a plurality of latency latches based on one of the plurality of adjusted sampling clock signals and one of the plurality of adjusted latch enable signals.

22. The method of claim 21, further comprising:
generating a plurality of transfer control signals based on a data output clock signal;
controlling outputs of a plurality of latency latches in a column unit based on the plurality of transfer control signals;
generating a plurality of output control signals based on one of the plurality of transfer control signals;
controlling outputs of the plurality of latency latches in a row unit based on the plurality of output control signals;
generating the latency signal based on one or more outputs of the plurality of latency latches, and
wherein the plurality of initial sampling clock signals are adjusted based on CAS latency information, and the plurality of initial latch enable signals are adjusted based on the CAS latency information.

23. The method of claim 22, wherein the given one initial sampling clock signal corresponds to a last sequential one of the plurality of initial sampling clock signals.

24. The method of claim 22, wherein each of the plurality of latency latches latches the given internal read command, in response to .a rising edge of a given adjusted sampling clock signal received, while a given adjusted latch enable signal received is set to a given logic level.

25. The method of claim 21, wherein the selectively latching step latches the given internal read command based on CAS latency information.

26. The method of claim 25, wherein the selectively latching step latches a first logic level at a given latency latch corresponding to the CAS latency information and latches a second logic level at one or more latency latches other than the given latency latch corresponding to the CAS latency information.

27. The method of claim 21, further comprising:
generating the plurality of initial sampling clock signals based on a received clock signal.

28. The method of claim 21, further comprising:
generating a plurality of transfer control signals and a plurality of output control signals based on a data output clock signal;
controlling a first plurality of latency latch outputs in a column unit based on the plurality of transfer control signals;
controlling a second plurality of latency latch outputs in a row unit based on the plurality of output control signals;
generating the latency signal based on the first and second plurality of latency latch outputs.

* * * * *